(12) United States Patent
Eltoukhy

(10) Patent No.: US 6,770,949 B1
(45) Date of Patent: Aug. 3, 2004

(54) ONE-MASK CUSTOMIZABLE PHASE-LOCKED LOOP

(75) Inventor: Shafy Eltoukhy, Los Gatos, CA (US)

(73) Assignee: Lightspeed Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/144,489

(22) Filed: Aug. 31, 1998

(51) Int. Cl.[7] .............................................. H01L 29/00
(52) U.S. Cl. ...................... 257/536; 257/537; 257/538; 257/539; 257/529
(58) Field of Search ................................ 257/536, 538, 257/323, 380, 624, 164, 379; 323/254

(56) References Cited

U.S. PATENT DOCUMENTS

| | | | | |
|---|---|---|---|---|
| 3,593,069 A | * | 7/1971 | Madden ............. | 148/DIG. 106 |
| 4,191,964 A | * | 3/1980 | Kant ................. | 148/DIG. 136 |
| 4,467,312 A | * | 8/1984 | Komatsu ..................... | 257/538 |
| 4,560,583 A | * | 12/1985 | Moksvold ..................... | 29/593 |
| 4,713,680 A | * | 12/1987 | Davis et al. ................ | 257/536 |
| 4,845,462 A | * | 7/1989 | van de Grift et al. ...... | 257/536 |
| 5,110,758 A | * | 5/1992 | Baskett ........................ | 437/171 |
| 5,493,148 A | * | 2/1996 | Ohata et al. ................... | 257/29 |
| 5,621,240 A | * | 4/1997 | Ellis ........................... | 257/379 |

FOREIGN PATENT DOCUMENTS

| | | | | |
|---|---|---|---|---|
| JP | 2-199866 | * | 8/1990 | ................. 257/536 |

OTHER PUBLICATIONS

"Monolithic Phase–Locked Loops and Clock Recovery Circuits", by Behzad Razavi, IEEE Press, 1996.

"CMOS Circuit Design, Layout, and Simulation", pp. 480, 384–387, 393–394, R. Jacob Baker, Harry W. Li and David E. Boyce, IEEE Press, 1998.

* cited by examiner

*Primary Examiner*—Wael Fahmy
*Assistant Examiner*—Nathan W. Hu
(74) *Attorney, Agent, or Firm*—Sarah Barone Schwartz; Quirk & Tratos

(57) ABSTRACT

A system and method in accordance with the invention minimizes the redesign burden in tuning and/or customizing PLLs on ICs. Variable resistors are placed in the PLL in places that facilitate tuning. The variable resistors are formed with a set of at least three contacts, where each contact is in electrical communication with a resistive area. A metal layer is used to form leads to the resistive area, where each lead is formed to be in electrical communication with only a selected subset of contacts from the set. In one embodiment, only the uppermost metal layer used in forming the IC is used to form the leads. Because the uppermost metal layer is utilized, the resistor value can be adjusted simply by selecting the subsets of contacts that are to be in electrical communication with the uppermost metal layer. In this manner, only one metal layer needs to be adjusted in tuning and/or customizing a PLL, rather than having to redesign and re-layout all metal layers and vias in the IC.

7 Claims, 10 Drawing Sheets

US 6,770,949 B1

ONE-MASK CUSTOMIZABLE PHASE-LOCKED LOOP

FIELD OF INVENTION

The invention relates generally to phase-locked loops ("PLLs") and particularly, the invention relates to tuning and customizing PLLs.

BACKGROUND OF THE INVENTION

Phase-locked loops (PLLs) are generally systems that use feedback to maintain an output signal in a specific phase relationship with a reference, or input, signal. PLLs are useful for jitter reduction, skew suppression, frequency synthesis, and clock recovery in numerous systems such as communication, wireless systems, digital circuits, and disk-drive electronics. While PLLs have been known for over half a century, they have gained considerable popularity in the past two decades due to demands for higher performance and low cost electronic systems as well as advances in integrated-circuit process technologies.

Despite advances in integrated-circuit (IC) formation processes, variations in processes regularly occur among different fabrication facilities ("fabs"). For instance, the doping technique used at one fab may result in a different sheet resistance from that achieved with a different doping technique used at a second fab. Likewise, lithographic and etch techniques may result in variation of the dimensions of elements being formed.

Unfortunately, PLLs tend to be sensitive to the quality and type of components that they are composed of, and particularly to sheet resistance and feature dimensions. Thus, when a PLL is included in an IC, slight variations among the processes used by different fabs can cause significant variations in the performance of PLLs produced at the respective fabs. So, if one IC design that includes a PLL is sent to a first fab for fabrication, and the same design is sent to a second fab, the performance of the PLLs in each respective IC would be different.

Hence, when a sensitive circuit design such as a PLL is to be sent to multiple fabs, the circuit will be required to be redesigned for each fab to account for the nuances of each fab process. Such redesign requires adjustment of transistor values, resistor values, and/or capacitor values as well as the redesign and layout of various layers of which the IC is formed. When more than one fab is going to be used for a particular design, or the fab that is going to be used is unknown at the time of the design, this redesign process can be burdensome. Moreover, if any changes wish to be made to the PLL after it has been designed, for instance if the IC is going to be used in an application that requires a different center frequency than that designed, similar burdens will be confronted. Often too, PLLs are predesigned and/or prefabricated into gate arrays or other partially customizable ASICs. The ability of the users of these ASICs to tune or customize the PLL is typically unavailable.

SUMMARY OF THE INVENTION

A system and method in accordance with the invention minimizes the redesign burden in tuning and/or customizing PLLs on ICs. In one embodiment, variable resistors are placed in the PLL in places that facilitate tuning. The variable resistors are formed with a set of at least three contacts, where each contact is in electrical communication with a resistive area. A metal layer is used to form leads to the resistive area, where each lead is formed to be in electrical communication with only a selected subset of the contacts from the set. In one embodiment, only the uppermost metal layer used in forming the IC is used to form the leads. Because the uppermost metal layer is utilized, the resistor value can be adjusted simply by selecting the subsets of contacts that are to be in electrical communication with the uppermost metal layer. In this manner, only one metal layer needs to be adjusted in tuning and/or customizing a PLL, rather than having to redesign and re-layout all metal layers and vias in the IC.

Such a system and method allows greater portability of IC designs among fabs and also facilitates easy circuit customization.

BRIEF DESCRIPTION OF THE DRAWINGS

The invention will be described with respect to particular embodiments thereof, and reference will be made to the drawings, which are not necessarily drawn to scale, and in which:

FIGS. 7a–7c, is a plan view of the layout of a resistor and illustrates a conventional manner of adjusting resistor values;

FIGS. 8a–8d, is a plan view of a resistor layout in accordance with the invention;

DETAILED DESCRIPTION

In order to reduce the design burdens associated with PLLs incorporated into ICs, a PLL in accordance with the invention is designed with resistors that can be varied in value in order to account for variances in fabrication processes such as changes in sheet resistance or feature dimensions. Creating designs with variable resistor values, however, is not enough: each variance of the values still entails redesign of the circuit. Therefore, in accordance with the invention, selected variable resistors are "programmed" using only the uppermost layer of metal used in the fabrication process. In this manner, a single design up to the uppermost metal layer can be provided to each fab that is to fabricate the IC, and only the uppermost layer of metal need be adjusted, rather than all layers. Hence, one design is easily portable among fabs and/or can be easily customized for use in a particular application (e.g., changing the center frequency).

Figure 1:
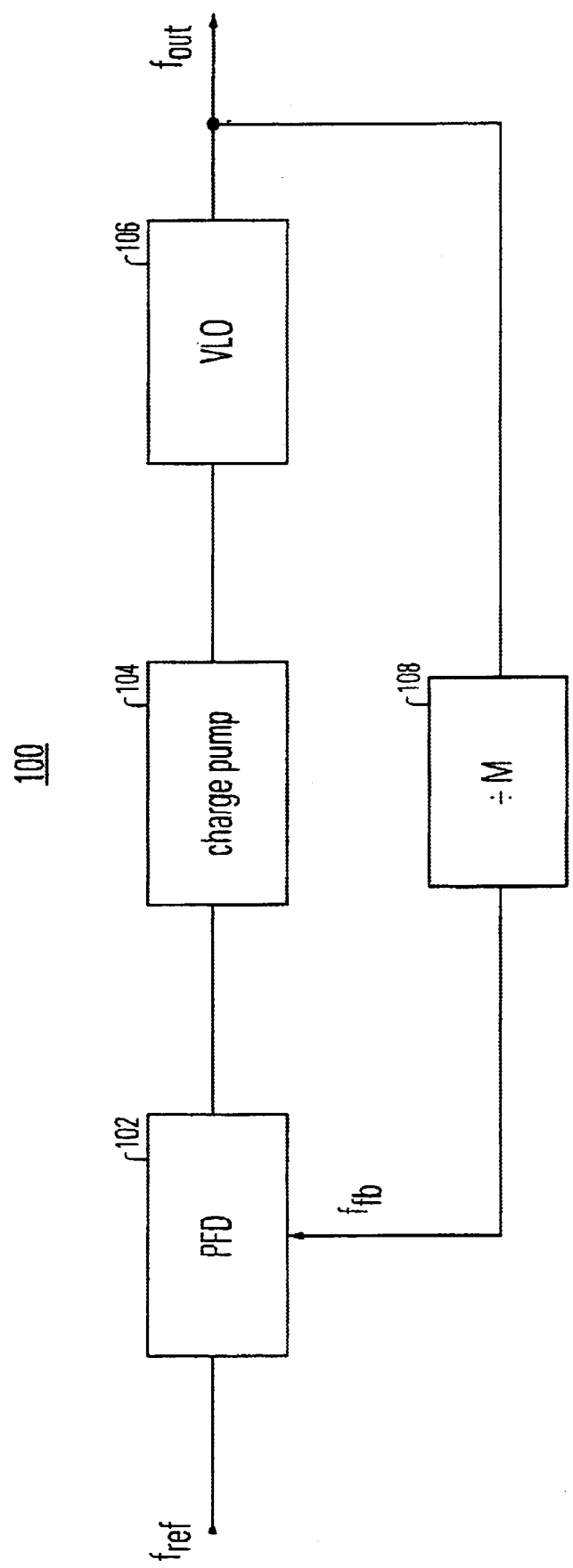
FIG. 1 is a generalized function block diagram of a PLL.

A general description of PLLs and elements of PLLs that are sensitive to the fabrication process will aid in understanding the invention. FIG. 1 shows a generalized functional block diagram of a PLL 100. PLL 100 receives a reference signal $f_{ref}$ that is input to phase/frequency detector (PFD) 102, which is in turn coupled to a charge pump 104.

Charge pump 104 is coupled to a voltage controlled oscillator (VCO) 106. The output of the VCO 106 is fed back to a ÷M circuit 108. The output of ÷M circuit 108 forms a second input to PFD circuit 102.

In general operation, the PFD 102 compares the reference signal $f_{ref}$ to the feedback signal $f_{fb}$. The PFD 102 generates a pulse output representative of the difference in the phase of the two input signals. The pulse output signal from PFD 102 is provided to charge pump 104, which produces a voltage representative of the phase difference. The VCO 106 produces an output $f_{out}$, which has a frequency correlating to the voltage input into the VCO. The output signal is then fed back to the PFD 102.

In many circuits, the forward signal path, including elements 102, 104, and 106, will amplify the frequency, e.g., output of frequency greater than (albeit predictably related to) the input frequency. Hence, many PLLs include a frequency divider 108 in the feedback loop so that meaningful comparison can be made at PFD 102.

As a result of the described operation, the PLL 100 should generate a signal at its output ($f_{out}$), that has a specific phase relationship with the reference signal at its input ($f_{ref}$). The frequencies of the output and input should bear a proportional relationship so that $f_{out}=Mf_{ref}$. For a more detailed description of PLLs, reference can be made to "Design of Monolithic Phase-Locked Loops and Clock Recovery Circuits—A Tutorial," by Behzad Razavi (IEEE Press 1996) incorporated herein by reference.

To illustrate how the elements of the PLL are affected by the various fabrication processes, a discussion is made of each element 102, 104, and 106 below. Typically, components which are formed mostly of digital elements will not be significantly affected by the fabrication process. Elements that are primarily analog in nature, however, tend to be affected by the fabrication process and require adjustment for optimal performance.

Phase/Frequency Detector 102

Figure 2:
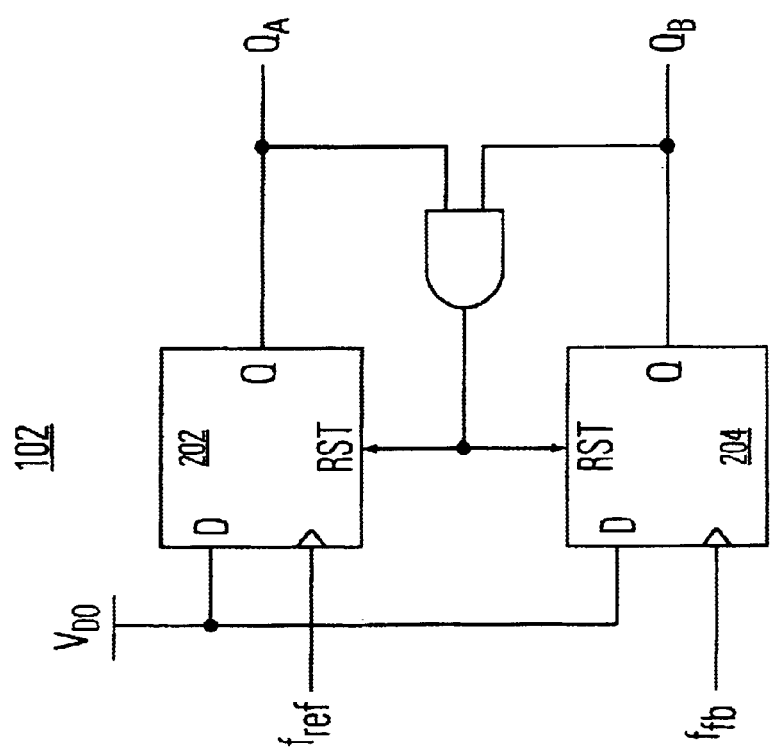
FIG. 2 is a functional block diagram of a phase/frequency detector.

The phase/frequency detector 102 is shown in more detail in FIG. 2. Typically, the PFD 102 is composed of two latches 202, 204 that each have an output, $Q_A$ and $Q_B$, respectively. The two outputs generated are not complementary. The outputs represent the difference in phase of the two signals, $f_{ref}$ and $f_{fb}$. If the reference signal frequency is greater than the feedback signal frequency ($f_{ref}$ leads $f_{fb}$), a pulse having a width representative of the phase difference is produced on $Q_B$. In the alternative, if the reference signal frequency is less than the feedback signal frequency ($f_{ref}$ lags $f_{fb}$), a pulse having a width representative of the phase difference is produced on $Q_A$.

Because the PFD shown in FIG. 2 is generally digital in nature, it is not generally affected by the fabrication process. Further, a PFD is only one example of an element that can be used to detect phase in a PLL. Other techniques are available such as a phase detector which produces a single signal proportional to the phase difference of the two input signals. The phase detector can be composed of, for instance, a Gilbert Cell or an R-S latch. Other methods for detecting phase and/or frequency are known in the art.

Charge Pump 104

Figure 3:
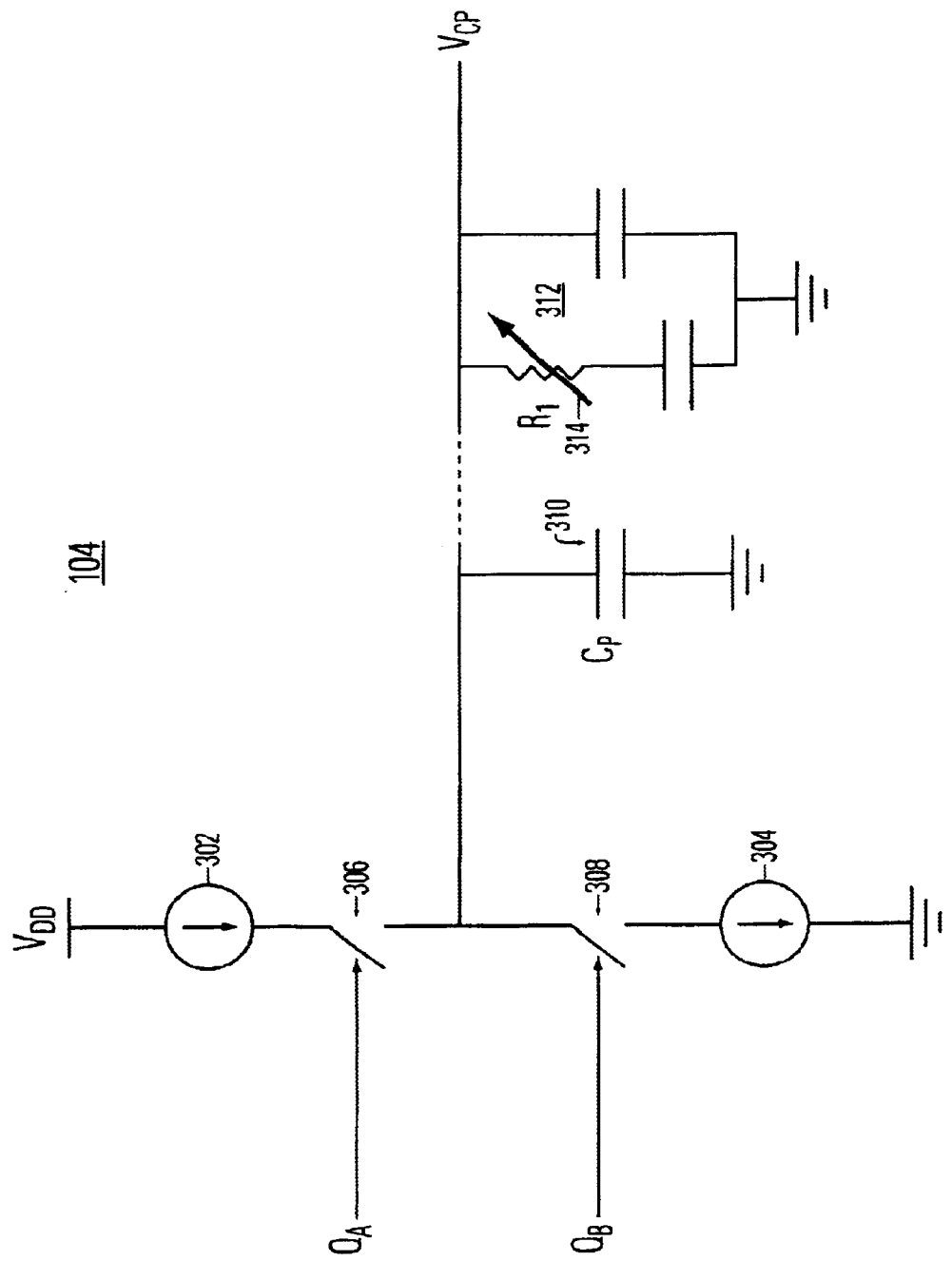
FIG. 3 is a generalized block diagram of a charge pump.

A charge pump 104 is depicted in FIG. 3 and is particularly sensitive to variance in the fabrication process. Generally, charge pump 104 consists of two switched current sources driving a capacitor. The current source 302 and the switch 306 are implemented with p-type MOSFETs, and the current source 304 and the switch 308 are implemented with n-type MOSFETs. When a pulse occurs on output $Q_A$ from PFD 102, switch 306 closes and charge is deposited on capacitor $C_p$ 310. Alternatively, when a pulse appears on PFD output $Q_B$, switch 308 closes, and charge from $C_p$ is removed. Hence, a voltage, $V_{cp}$, is output from charge pump 104 that will increase or decrease depending on the comparison made at PFD 102.

In addition, a filter 312 is sometimes provided to smooth the output signal $V_{cp}$ from charge pump 104. The performance of filter 312 is often subject to variances due to fabrication processes. For instance, the lithographic process used may affect the width of the resistor R1 314, thus causing the ohmic value of R1 to be different than that designed. Hence, in conventional systems, filter 312 is often kept off the IC upon which the PLL is formed so it can be independently adjusted.

To keep the filter 312 on the same IC with the rest of PLL 102, resistor R1's value is adjusted in accordance with the invention. The method by which the resistor value is adjusted will be discussed in more detail later with respect to FIGS. 7–10.

Figure 4:
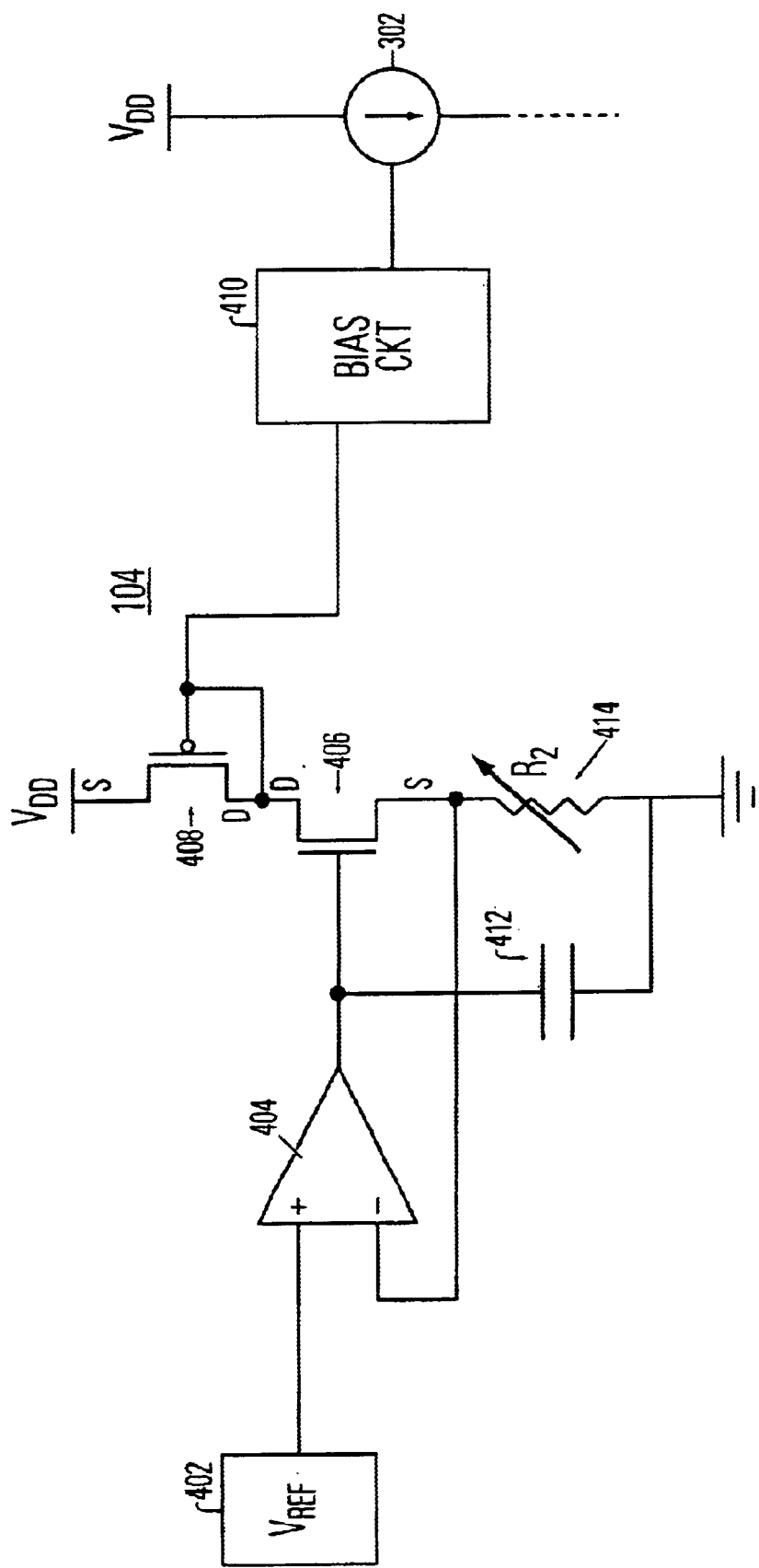
FIG. 4 is a generalized block diagram of a current-source bias circuit.

In addition, each current source 302 and 304 is required to be biased with a bias current. To create a bias current, a circuit such as that shown in FIG. 4 may be used. A reference circuit 402 outputs a reference voltage which is provided to comparator 404. The output of comparator 404 is supplied to the gate of transistor 406. The drain of transistor 406 supplies a second input to comparator 404. The drain of transistor 406 is coupled to the drain of transistor 408. The source of transistor 408 is coupled to a voltage $V_{DD}$. The gate of transistor 408 is coupled to bias circuit 410. Bias circuit 410 converts the voltage supplied to it by transistor 408 into a bias current which in turn is supplied to the respective current sources, 302 and 304 (only 302 is shown). In addition, the drain of transistor 406 is coupled to resistor R2 414. The gate of transistor 406 is also coupled to a capacitor 412. The second leads of resistor R2 414 and capacitor 412 are each coupled to ground. The circuit of FIG. 4 has many analog elements and is affected in its performance by the fabrication process used, including doping and lithographic techniques. If the bias current provided by the circuit of FIG. 4 is not accurate, then the $V_{cp}$ output of the charge pump (FIG. 3) may be inaccurate as well. Hence, resistor R2's value is adjusted in accordance with the invention to accommodate those fabrication process differences, as will be discussed in more detail below.

Figure 5:
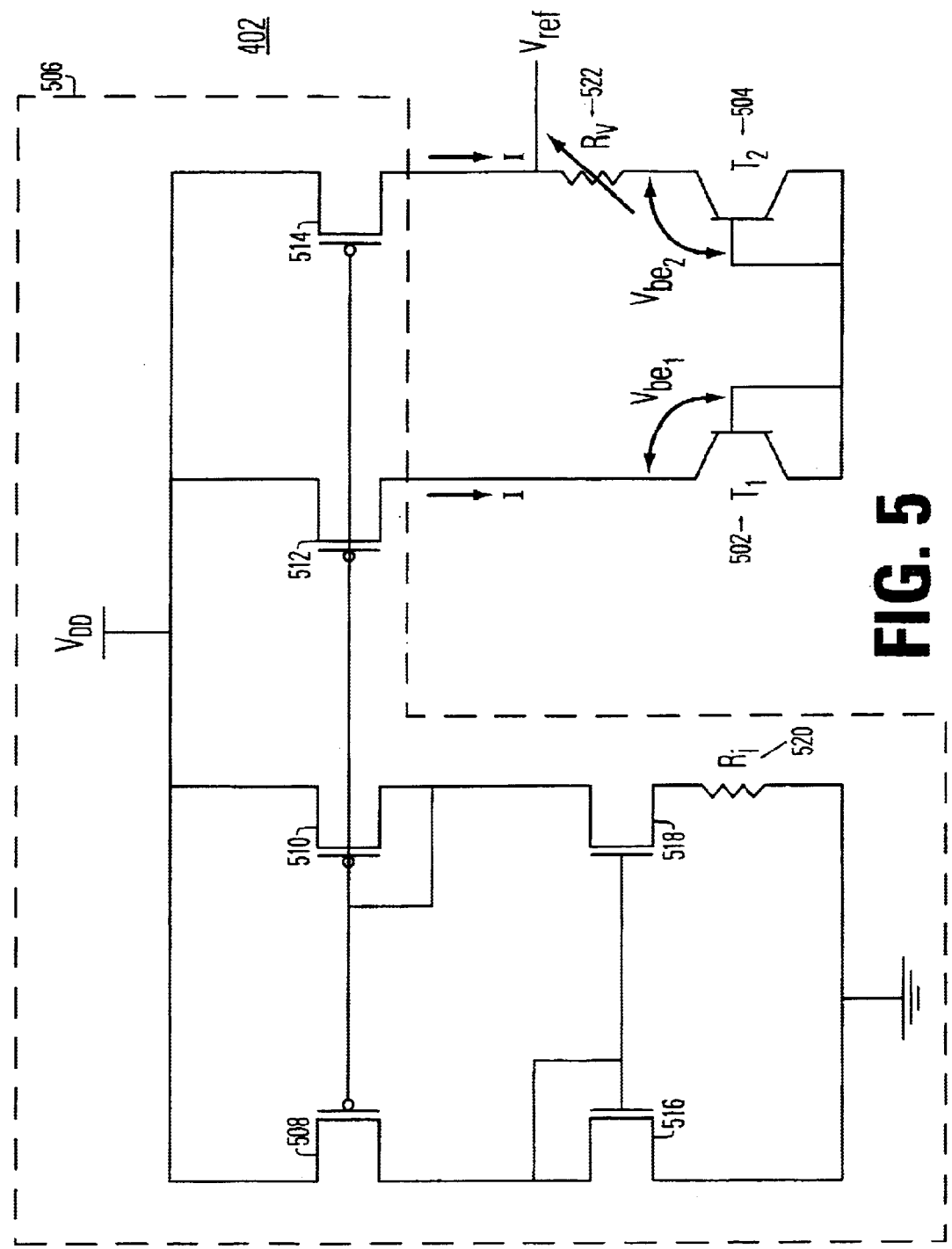
FIG. 5 is a generalized block diagram of a reference voltage circuit.

Moreover, voltage reference circuit 402 also tends to be analog in nature and is further influenced by the fabrication process utilized. Voltage reference circuits are well-known in the art, and one example is shown in FIG. 5. FIG. 5 shows two bipolar transistors $T_1$ 502 and $T_2$ 504 driven by a current source 506. The current source includes several p-type MOSFET transistors 508, 510, 512 and 514, as well as two n-type MOSFET transistors 516 and 518. In addition current source 506 includes resistor $R_i$ 520 coupled between transistor 518 and ground.

Current source 506 outputs a current I from each respective transistor 512 and 514. I is inversely proportional to $R_i^2$:

$$I \alpha \frac{1}{R_i^2}$$

Hence, current I can be adjusted and controlled by varying $R_i$ 520, particularly when process variations would result in a different I than desired otherwise.

The current I is provided to each transistor $T_1$ 502 and $T_2$ 504. Each transistor 502 and 504 has an area, where the area of $T_1$ is A and the area of $T_2$ is KA. The current I as drawn through transistors $T_1$ and $T_2$ can be expressed as follows:

$$I = AJ_s e^{\frac{V_{be1}}{V_T}} = KAJ_s e^{\frac{V_{be2}}{V_T}}.$$

Hence, the current I is directly proportional to current density $J_s$. Yet $J_s$ is influenced by the fabrication process utilized. Therefore, since $V_{ref} = I \, R_v + V_{be2}$, adjusting the value of $R_v$ 522 will take into account the variations in the fabrication process, minimizing differences in $V_{ref}$ from fab to fab.

Voltage Controlled Oscillator

Figure 6:
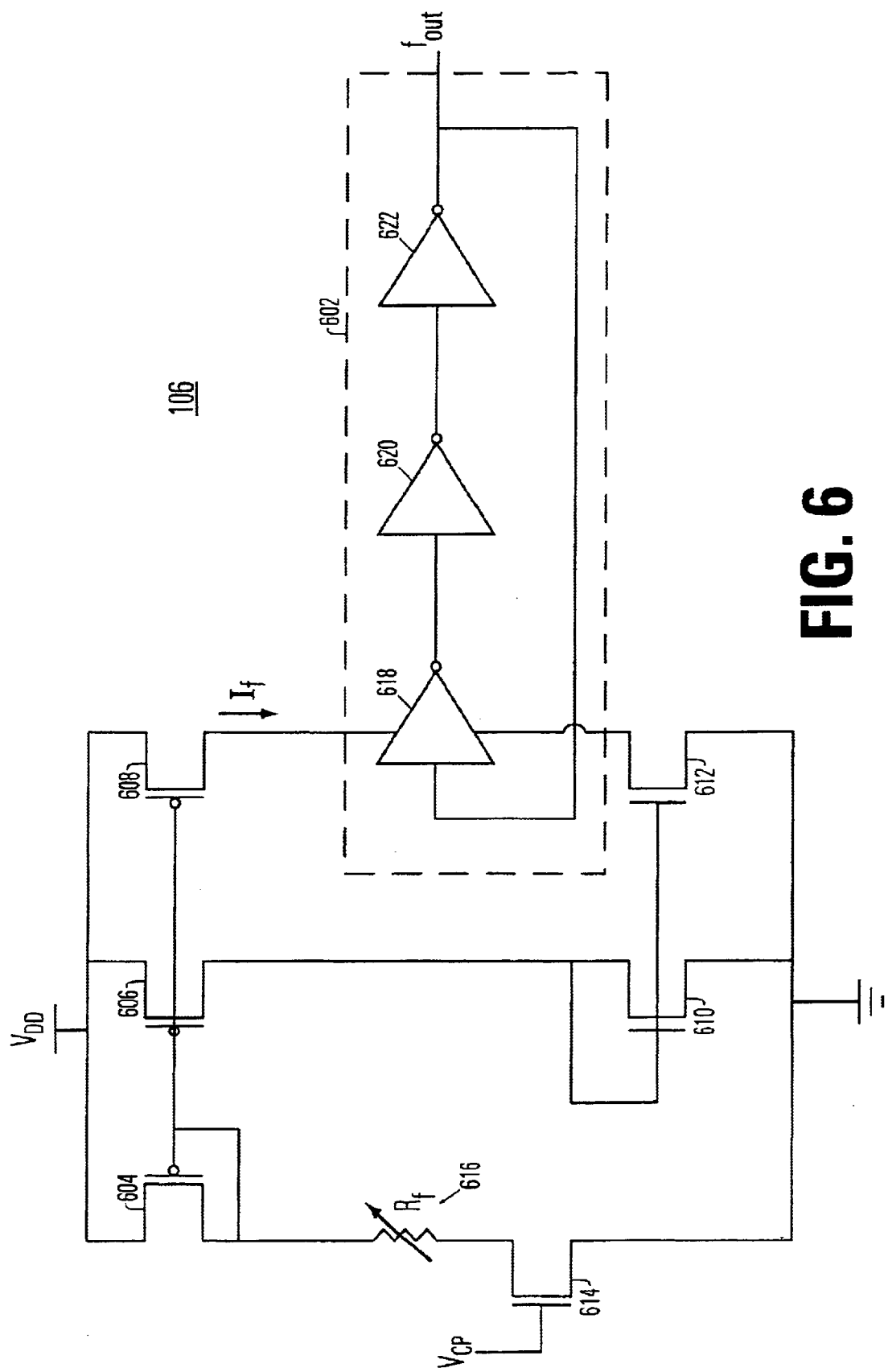
FIG. 6 is a generalized block diagram of a voltage-controlled oscillator.

Finally VCO 106 is shown in FIG. 6. VCO 106 includes a ring oscillator 602. Ring oscillator 602 typically includes an odd number of inverters. Three inverters 618, 620 and 622 are shown in FIG. 6 but more could be included. The rest of the elements shown in FIG. 6 form a current source for controlling ring oscillator 602, including p-type MOSFET transistors 604, 606, and 608, n-type MOSFET transistors 610, 612, and 614, and resistor $R_f$ 616. $V_{cp}$ is coupled from charge pump 104 to circuit 106 through transistor 614. The current $I_f$ output through the drain of transistor 608 is a function of both $V_{cp}$ and $R_f$:

$$I_f \triangleq f\left(V_{cp}, \frac{1}{R_f}\right)$$

The frequency of oscillation in ring oscillator 602 is controlled by $I_f$. Hence, in normal operations, when $V_{cp}$ rises or falls, the frequency of oscillation changes. However, if there are variances in the fabrication process, $R_f$ 616 can be used to ensure that ring oscillator 602 is oscillating in the appropriate frequency range.

The description of the PLL and its various elements above was given by way of illustration only. Examples are shown where resistances could be adjusted to account for variances in fabrication processes. Other embodiments of PLLs may use other circuit resistors or add resistors elsewhere in the circuit to achieve similar results. Hence, the examples given should not be construed to limit the invention.

Variable Resistor Formation

Using variable resistors as described above will enable adjustment and tuning of the PLL circuit. But, the PLL circuit (and hence the entire IC) will still have to be redesigned with the appropriate resistor values for each fab.

Figure 7:
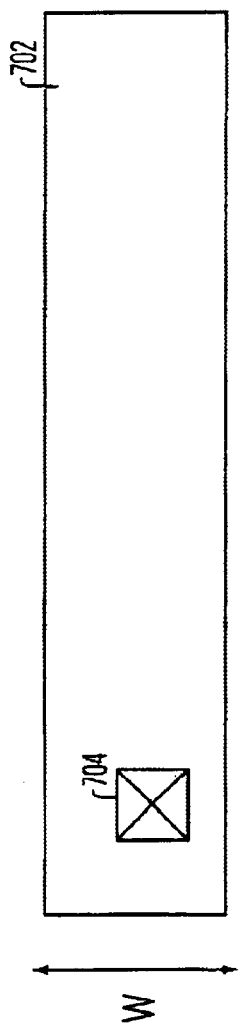
FIG. 7, including
Figure 7:
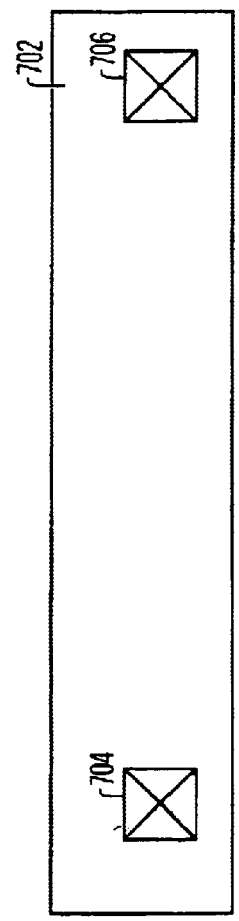
Figure 7:
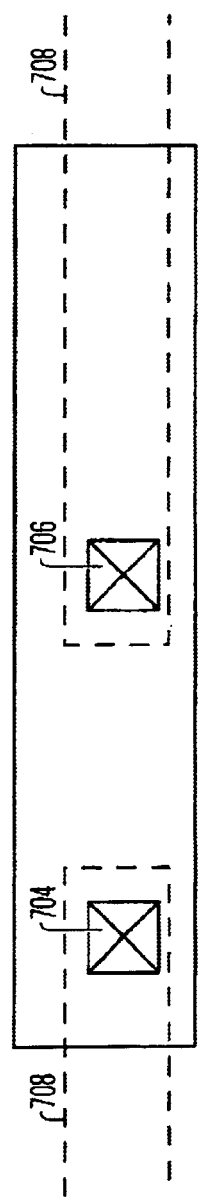

For instance, many conventional IC designs address variable resistances by designing and laying out a resistor as shown in the plan views of FIG. 7. In FIG. 7a, a resistive area 702 is placed in the IC design to implement a resistor. The value of the resistor depends on the length of the resistive area between contacts. One contact 704 is fixed in position. The second contact is not placed in the IC design until the chosen fab lets the circuit designer know the specifics of its process, e.g., sheet resistance, lithographic limitations (the width W of resistive area 702 may have a range of variation for the process, W±Δ). The designer then adds into the design the second contact 706 such that the resistive area between contacts 704 and 706 creates the desired resistance given the fabrication process utilized.

So for example in FIG. 7b, if a large resistor is required, contact 706 is placed toward the end of the resistive area 702, away from contact 704. In contrast, if a smaller resistor value is required, contacts 704 and 706 are placed closer together, as shown in FIG. 7c. Of course, the largest resistive value that can be implemented is dictated by the size of the resistive area 702. The resistor is coupled to the rest of the circuit by means of a metalization layer applied over the resistive area and in contact with each of contacts 704 and 706, forming the resistor leads. The metal layer 708 is shown in phantom in FIG. 7c.

Figure 9:
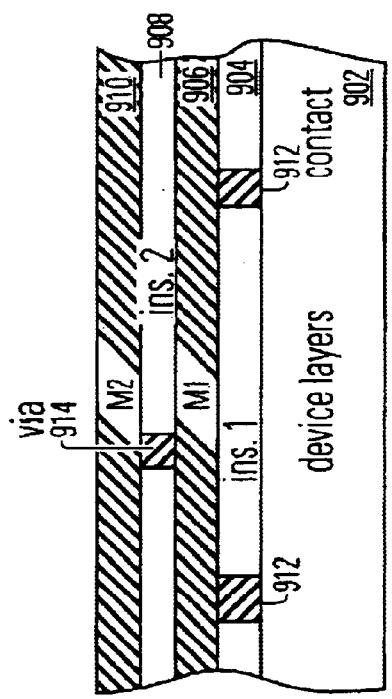
FIG. 9 is a cross-sectional view of the layers that form a typical integrated circuit.

Integrated circuits tend to be formed with various layers. Shown in FIG. 9 are device layers 902, in which resistive area 702 would typically be formed. The term "device layers" is meant herein to denote doped silicon regions or to denote layers formed over such regions such as polysilicon used in forming transistors, resistors, etc. Over layers 902 is a first insulating layer 904. Over the first insulating layer 904 is a first metal layer (M1) 906. Over the M1 layer 906 is a second insulating layer 908, over which is formed a second metal layer (M2) 910. The metal layers are typically used to form interconnections among devices. Although two insulating layers and two metal layers are shown in FIG. 9, ICs are often formed with more than two of either of such layers. Hence, two insulating and two metal layers are shown for illustrative purposes only and should not be construed to limit the invention.

To connect the various metal layers to the device layers or to each other, contacts 912 and vias 914 are formed in the various insulating layers and are also filled with metal, which metal may be different from that used for the M1 and M2 layers. Traditionally, the term "contact" denotes the first metal layer connections to the device layers. The term "via" typically denotes the interconnecting together of metal layers. These terms, however, are used interchangeably herein.

Referring again to FIG. 7, the technique illustrated for adjusting resistor values requires the circuit designer to design the PLL circuit each time a resistor value must be changed. Such a redesign requires that each metal layer and each contact/via needs to be redesigned and re-layed-out to implement the resistor change. Such redesigns are time consuming and costly.

Figure 8:
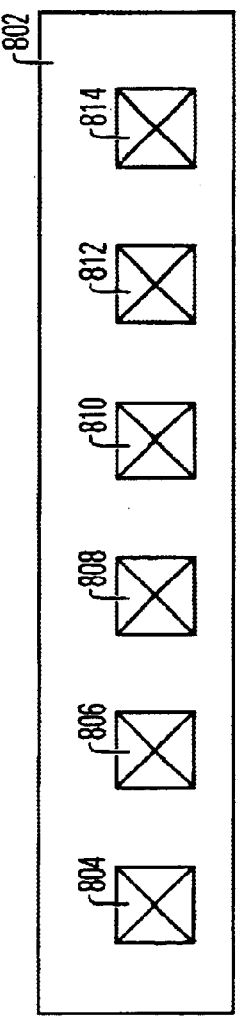
FIG. 8, including
Figure 8:
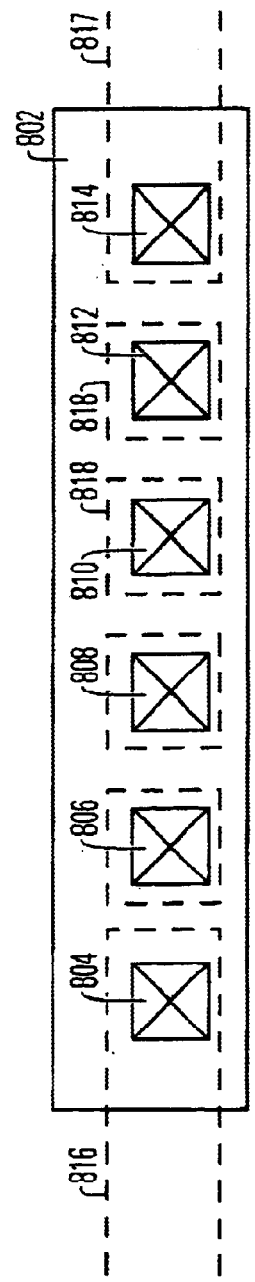
Figure 8:
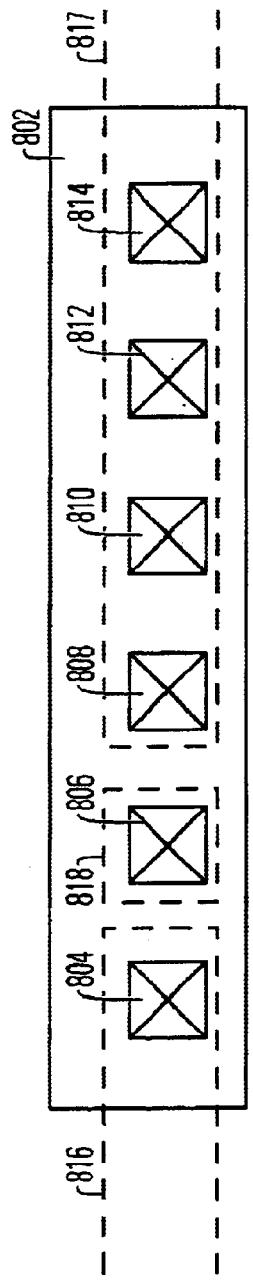

Therefore, the plan views of FIG. 8 illustrate a method in accordance with the invention by which to overcome the redesign problem. Rather than moving the contacts in the resistive area to adjust the resistor value, the resistive area is instead initially designed to include a plurality of contacts. For a resistor, which has two leads, more than two contacts should be included. An embodiment of the invention used with other devices may require fewer or more contacts, although more contacts than are minimally required to implement the device should be included.

The result is shown in FIG. 8a, which shows resistive area 802 and a set of contacts 804–814. Although six contacts are shown in FIG. 8a, it is to be understood that more or fewer contacts could be provided. The contacts shown in FIG. 8 are also "stacked contacts," meaning that vias above each of the contacts are aligned, or "stacked," with the contacts through each of the insulating and metal layers.

The resistor value is adjusted by selectively adjusting only the uppermost metal layer. Referring to FIG. 8b, metal 816 is used to form the first lead of the resistor and is brought in contact with contact 804. Metal 817 is used to form the second lead of the resistor. If a large resistor value is required, metal 817 is brought in contact with few contacts. As shown in FIG. 8b, metal 817 is brought in contact only with contact 814, thereby creating the largest resistor possible with resistive region 802. The rest of contacts 806–812 are covered with floating metal, or "capped," in a manner such that they do not contact leads 816, 817 or one another.

In contrast, as shown in FIG. 8c, if a smaller resistor value is required, more contacts are covered with metal 817. As shown in FIG. 8c, contacts 808–814 are contacted with metal 817, while contact 806 remains capped with metal 818. In this manner only a small part of resistive area 802 is used to form the resistor, namely that part of resistive area 802 that lies between contacts 804 and 808.

As shown in FIGS. 8b and 8c, in one embodiment lead 816 is fixed in the design, and is always in contact with contact 804. Lead 817 is "sliding" —its position is adjusted to vary the value of the resistor. This sliding lead 817 is sometimes also referred to herein as a "sliding contact" since it results in the ability to contact the resistor in a selectably movable location.

Figure 8D:
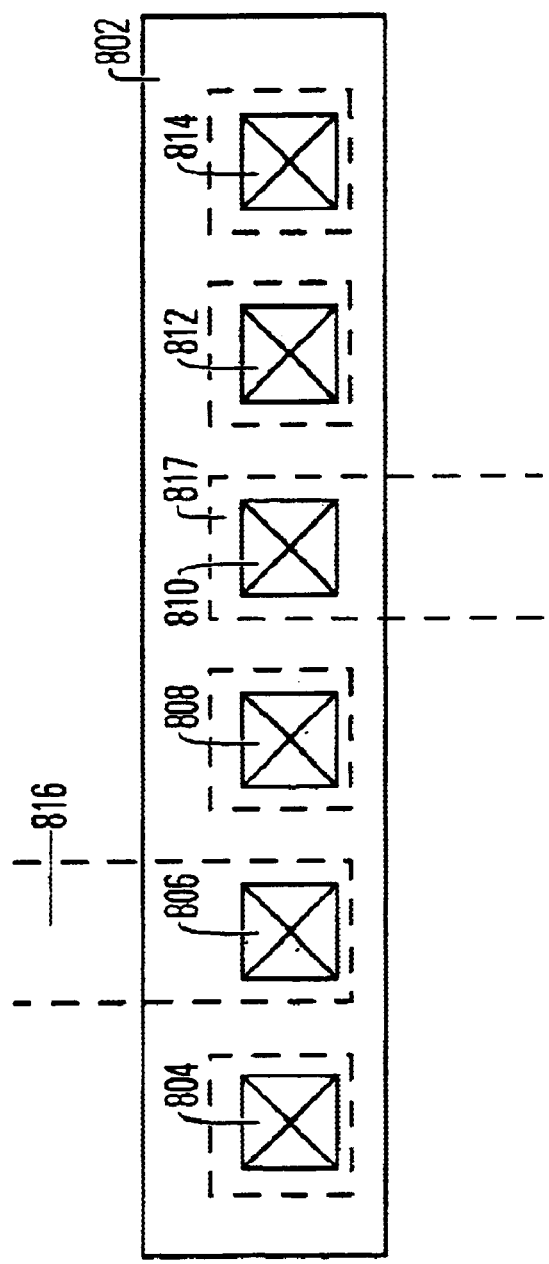

Although leads 816, 817 and floating metal caps 818 are designated with differing reference numbers, it is to be understood that in one embodiment each of these metal regions are formed with the uppermost metal layer Moreover, although the resistor is shown to be variable by sliding lead 817 over selected contacts, it is to be understood that the uppermost metal layer could be selectively brought into electrical communication with selected contacts in a variety of ways. For instance, as shown in FIG. 8d, lead 817 could be brought from above or below region 802 to selectively come into contact with only one contact, e.g., contact 810. Nonetheless, it is believed that the method described with respect to FIGS. 8b and 8c minimizes the redesign efforts since only the uppermost layer is to be adjusted, and then only that portion immediately over the resistive regions.

As described, in one embodiment the metal of leads 816, 817 and caps 818 (FIG. 8) is provided as the uppermost layer of metal in the fabrication of the integrated circuit, which includes the PLL in accordance with the invention. Referring to the cross-section of FIG. 10, the formation of the variable resistor in accordance with the invention is explained. A resistive region 802 is formed in a semiconductor substrate 1001. Alternatively, the resistive region could be implemented using layers that are formed above substrate 1001, such as a polysilicon layer. The in-substrate region shown is thus used for illustrative purposes only. Other semiconductor regions and devices 1004 can also be formed on the same wafer.

Over the substrate layer (or other device forming layers such as polysilicon) is formed the first insulating layer 1006. Contacts 1014 are formed in the first insulating layer 1006 to devices 1004. In addition, a set of contacts 1016–1026 is formed through the first insulating layer 1006 to resistive region 802. More or fewer contacts can be formed to resistive region 802 than illustrated. There should, however, be at least three contacts.

Over insulating layer 1006, a first metal layer M1 1008 is formed. The M1 layer 1008 is placed in a disconnected manner over contacts 1016–1026.

A second insulating layer 1010 is next formed. Vias 1030–1040 are etched into insulating layer 1010 and then filled with metal. As shown, both contacts 1016–1026 and vias 1030–1040 are filled with a metal that is different from that used in M1 1008 and M2 1012 layers. In other embodiments, however, the metals used can be the same. As shown, the vias 1030–1040 formed through insulating layer 1010 align to respective contacts 1016–1026, forming "stacked contacts." Alternative embodiments, however, need not form stacked contacts, provided the vias are in electrical communication with the appropriate respective contacts. For instance, via 1015 is in electrical communication with contact 1014, although they are not in alignment. The stacked contacts formed with contacts 1016–1026 and respective aligned vias 1030–1040 roughly correspond with contacts 804–814 shown in FIG. 8.

Figure 10:
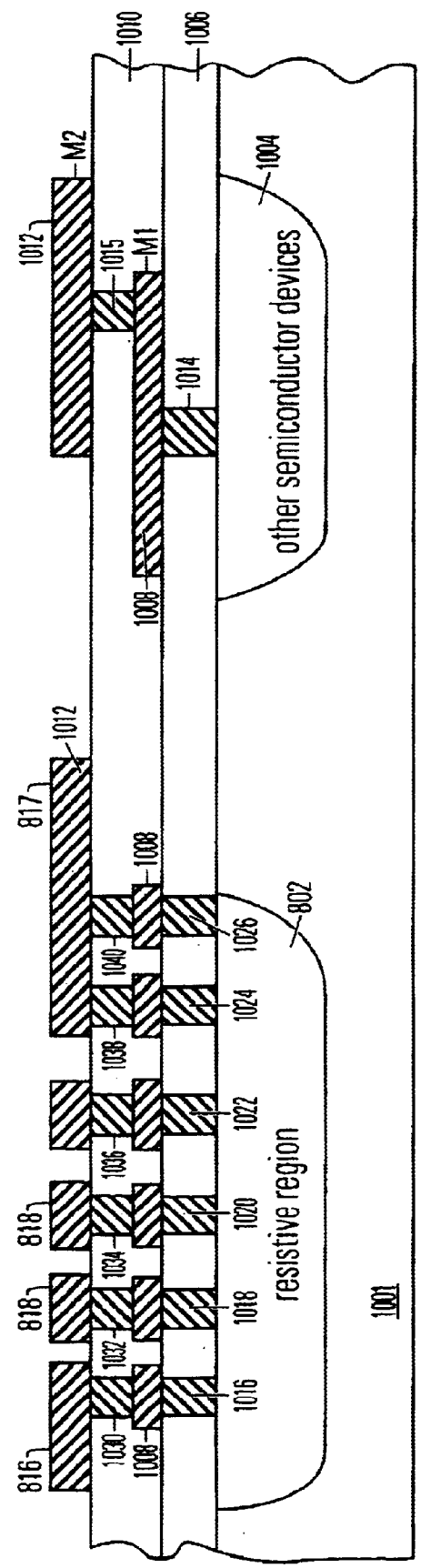
FIG. 10 is a cross-sectional view of a variable resistor formed in accordance with the invention.

Over insulating layer 1010, the second metal layer 1012 is formed. The M2 layer is selectively placed over the stacked contacts, allowing the M2 layer to be in electrical communication with the resistive region 802. In the embodiment shown, the M2 layer 1012 is only placed over those vias that will yield the resistor value selected. In this manner, only one metal layer needs to be redesigned—and only slightly—depending on the process utilized. In FIG. 10, lead 816 is placed in contact with via 1030. Lead 817 is placed in contact with vias 1038 and 1040. Vias 1032–1036 are capped with floating metal 818 from M2 layer 1012, but are disconnected from leads 816, 817 and from one another.

Although the description above frequently refers to tuning PLLs as a result of the fabrication process used, the principles of the present invention could be applied for other reasons. For instance, variable resistances in accordance with the invention can be utilized simply for the purposes of circuit customization. In an IC that is predesigned and/or prefabricated up to the last metal layer, and includes a PLL (for instance in a gate array or other ASIC), a user of the IC may wish to alter the center frequency of the PLL from that predesigned and/or prefabricated. Varying the resistor values in accordance with the invention will allow such customization of the center frequency. Other customization is also possible.

Hence, a process has been described that will be used with circuits that are predesigned and/or prefabricated except for the uppermost metal layer or layers. The system in accordance with the invention will enable tuning and/or customization of PLLs on IC's while only having to specify slight changes to the uppermost metal layer.

It should be understood that the particular embodiments described above are only illustrative of the principles of the present invention, and various modifications could be made by those skilled in the art without departing from the scope and spirit of the invention. For instance, although the invention is described in the context of variable resistors, the invention could also be applied to make adjustments to other types of devices. Thus, the scope of the present invention is limited only by the claims that follow.

What is claimed is:

1. An integrated circuit, comprising:

a resistive region of fixed area;

at least one insulating layer formed over said resistive region, said insulating layer including a set of at least three contacts formed therethrough to be in electrical communication with said resistive region;

wherein the set of contacts are to be used with a pair of leads to be later formed with a conducting layer to be formed over the insulating layer, wherein the conducting layer is used for at least one of circuit customization or tuning, wherein at least one lead is to be formed over a variably selectable subset of the set of contacts, and wherein each lead is to be in electrical communication with at least one respective contact, wherein the ohmic value of a resistor formed with the resistive region is to be determined by a number of contacts in the subset of contacts.

2. The integrated circuit of claim 1, further including:

the pair of leads formed in the conducting layer.

3. The integrated circuit of claim 1, wherein said resistive region is included in a phase-locked loop.

4. An integrated circuit, comprising:

a phase-locked loop (PLL), said PLL including a variable resistor, said variable resistor including:

a resistive region of fixed area;

a plurality of insulating layers formed over said resistive region, said plurality of insulating layers having an uppermost insulating layer, said uppermost insulating layer having a set of at least three vias formed therethrough, said vias formed to be in electrical communication with said resistive region;

at least one conducting layer interspersed with said plurality of insulating layers;

a pair of leads formed with a conducting layer formed over the uppermost insulating layer, wherein the conducting layer is used for at least one of circuit customization or tuning, wherein at least one lead is formed over a selected subset of the set of vias, and wherein each lead is in electrical communication with at least one respective via, wherein the ohmic value of the variable resistor is determined by a number of vias in the the selected subset of vias.

5. An integrated circuit, comprising:

a resistive region of fixed area;

at least one insulating layer formed over said resistive region, said insulating layer including a set of at least three vias formed therethrough to be in electrical communication with said resistive region;

a pair of leads formed with a conducting layer formed over the insulating layer, wherein the conducting layer is used for at least one of circuit customization or tuning, wherein at least one lead is formed over a selected subset of the set of vias, and wherein each lead is in electrical communication with at least one respective via, wherein the ohmic value of a resistor formed with the resistive region is determined by a number of vias in the selected subset of vias.

6. An integrated circuit, comprising:

a resistive region of fixed area;

at least one insulating layer formed over said resistive region, said insulating layer including a set of at least three vias formed therethrough to be in electrical communication with said resistive region;

a pair of leads formed with a conducting layer formed over the insulating layer, wherein the conducting layer is used for at least one of circuit customization or tuning, wherein each lead is in electrical communication with a respective selected subset of the set of vias, wherein the ohmic value of a resistor formed with the resistive region is determined by the selected subsets of vias.

7. The integrated circuit of claim 6, wherein the set of vias are formed in linear alignment with one another.

* * * * *